(12) United States Patent
Su

(10) Patent No.: US 7,271,630 B2
(45) Date of Patent: Sep. 18, 2007

(54) PUSH-PULL BUFFER AMPLIFIER AND SOURCE DRIVER

(75) Inventor: Wei-Zen Su, Keelung (TW)

(73) Assignee: DenMOS Technology Inc., Hsinchu (TW)

( * ) Notice: Subject to any disclaimer, the term of this patent is extended or adjusted under 35 U.S.C. 154(b) by 85 days.

(21) Appl. No.: 11/160,103

(22) Filed: Jun. 9, 2005

(65) Prior Publication Data

US 2006/0152256 A1    Jul. 13, 2006

(30) Foreign Application Priority Data

Jan. 13, 2005    (TW) .................................. 94100958

(51) Int. Cl.
*H03K 3/00*    (2006.01)

(52) U.S. Cl. ..................... 327/112; 326/87; 330/255; 330/264

(58) Field of Classification Search ................ 327/112; 326/87; 330/255, 264
See application file for complete search history.

(56) References Cited

U.S. PATENT DOCUMENTS

| | | | | |
|---|---|---|---|---|
| 5,959,475 A * | 9/1999 | Zomorrodi | ................ | 327/112 |
| 6,137,360 A | 10/2000 | Memida | ................ | 330/253 |
| 6,331,846 B1 | 12/2001 | Nakao | ................ | 345/96 |
| 6,507,245 B2 * | 1/2003 | Tai | ................ | 330/255 |
| 7,030,865 B2 * | 4/2006 | Ishiyama | ................ | 345/204 |
| 7,170,351 B2 * | 1/2007 | Shimatani | ................ | 330/255 |
| 2004/0227713 A1 * | 11/2004 | Sun | ................ | 345/98 |

OTHER PUBLICATIONS

Weste et al., Principles of CMOS VLSI Design: A Systems Perspective, 1993, Addison-Wesley Publishing Company, Second Edition, pp. 78-79.*

* cited by examiner

*Primary Examiner*—Tuan T. Lam
*Assistant Examiner*—William Hernandez
(74) *Attorney, Agent, or Firm*—Jianq Chyun IP Office

(57) ABSTRACT

A push-pull buffer amplifier and a source driver are provided. In the buffer amplifier, the N-type and the P-type comparators compare an input signal and an output signal. The input terminals of the first and the second inverters are coupled to the first output terminals of the N-type and the P-type comparators, respectively. The first and the fourth transistors are controlled by the second output terminal of the N-type comparator and the output terminal of the second inverter, respectively, so that the first voltage line charges/discharges an output load. The second and the third transistors are controlled by the second output terminal of the P-type comparator and the output terminal of the first inverter, respectively, so that the second voltage line charges/discharges the output load.

38 Claims, 3 Drawing Sheets

PUSH-PULL BUFFER AMPLIFIER AND SOURCE DRIVER

CROSS-REFERENCE TO RELATED APPLICATION

This application claims the priority benefit of Taiwan application serial no. 94100958, filed on Jan. 13, 2005. All disclosure of the Taiwan application is incorporated herein by reference.

BACKGROUND OF THE INVENTION

1. Field of the Invention

The present invention relates to a buffer amplifier, and more particularly, to a rail-to-rail push-pull buffer amplifier and a source driver with such buffer amplifier application.

2. Description of the Related Art

In an electronic circuit, a buffer amplifier usually is used to transmit a signal to a terminal and to drive the next stage circuit. For example, in a liquid crystal display, a source driver comprises a buffer amplifier to apply an analog voltage required for the liquid crystal display to the liquid crystal display. The buffer amplifier, therefore, is an essential device in the source driver. An excellent buffer amplifier provides high-speed operation and accuracy. In the application of a portable device, such as a notebook or a personal digital assistant, power consumption is the most concerned issue of a buffer amplifier.

U.S. Pat. No. 6,331,846 discloses an operational amplifier which removes offset of the circuit. The prior art comprises complicate circuits, frequently switching signal routes to achieve its objects. The prior art circuit, however, results in high costs of the circuit, and the frequently switching the signal routes also generates noises.

In addition, U.S. Pat. No. 6,137,360 discloses a voltage follower with a rail-to-rail buffer amplifier. Although the offset-removing mechanism is not required, the charging rate and discharging rate are not equal in the prior art technology while the next stage circuit is driven.

SUMMARY OF THE INVENTION

Accordingly, the present invention is directed to a push-pull buffer amplifier to achieve the low-power-consumption rail-to-rail input/output feature, and to speed up charging/discharging rate while driving a next stage circuit. The charging rate is equal to the discharging rate.

The present invention is also directed to a source driver so that the charging rate of the driving pixel is equal to its discharging rate. Accordingly, the low-power-consumption feature can be achieved.

The present invention provides a push-pull buffer amplifier to transmit an input signal to generate an output signal. The push-pull buffer amplifier comprises an N-type comparator, a P-type comparator, a first inverter, a second inverter, a first output stage, and a second output stage. Wherein, the first output stage comprises a first transistor and a second transistor; the second output stage comprises a third transistor and a fourth transistor. The N-type comparator compares the input signal and the output signal. A first output terminal of the N-type comparator and a second output terminal of the N-type comparator inversed thereto output a comparison result, wherein N-type transistor in the N-type comparator serves as its input stage. The P-type comparator compares the input signal and the output signal. A first output terminal of the P-type comparator and a second output terminal of the P-type comparator inversed thereto output another comparison result, wherein P-type transistor in the P-type comparator serves as its input stage. An input terminal of the first inverter is coupled to the first output terminal of the N-type comparator. An input terminal of the second inverter is coupled to the first output terminal of the P-type comparator. A first source/drain of the first transistor is coupled to a first voltage line, and a gate of the first transistor being coupled to the second output terminal of the N-type comparator. A first source/drain of the second transistor is coupled to a second source/drain of the first transistor, a second source/drain of the second transistor is coupled to a second voltage line, and a gate of the second transistor is coupled to the second output terminal of the P-type comparator. A gate of the third transistor is coupled to an output terminal of the first inverter, a first source/drain of the third transistor is coupled to the second voltage line, and a second source/drain of the third transistor is coupled to the second source/drain of the first transistor, and generates the output signal. A first source/drain of the fourth transistor is coupled to the second source/drain of the third transistor, a second source/drain of the fourth transistor is coupled the first voltage line, and a gate of the fourth transistor is coupled to an output terminal of the second inverter.

The present invention provides a source driver to drive the display panel. The source driver comprises a digital/analog converter and a push-pull buffer amplifier. The digital/analog converter converts a digital video signal to output an analog input signal. The push-pull buffer amplifier is coupled to the digital/analog converter to transmit the input signal and generates an output signal to drive the display panel. Wherein, the push-pull buffer amplifier comprises an N-type comparator, a P-type comparator, a first inverter, a second inverter, a first transistor, a second transistor, a third transistor, and a fourth transistor. The N-type comparator compares the input signal and the output signal. A first output terminal of the N-type comparator and a second output terminal of the N-type comparator inversed thereto output a comparison result, wherein an N-type transistor in the N-type comparator serves as its input stage. The P-type comparator compares the input signal and the output signal. A first output terminal of the P-type comparator and a second output terminal of the P-type comparator inversed thereto output another comparison result, wherein a P-type transistor in the P-type comparator serves as its input stage. An input terminal of the first inverter is coupled to the first output terminal of the N-type comparator. An input terminal of the second inverter is coupled to the first output terminal of the P-type comparator. A first source/drain of the first transistor is coupled to a first voltage line, and a gate of the first transistor being coupled to the second output terminal of the N-type comparator. A first source/drain of the second transistor is coupled to a second source/drain of the first transistor, a second source/drain of the second transistor is coupled to a second voltage line, and a gate of the second transistor is coupled to the second output terminal of the P-type comparator. A gate of the third transistor is coupled to an output terminal of the inverter, a first source/drain of the third transistor is coupled to the second voltage line, and a second source/drain of the third transistor is coupled to the second source/drain of the first transistor, and generates the output signal. A first source/drain of the fourth transistor is coupled to the second source/drain of the third transistor, a second source/drain of the fourth transistor is coupled the first voltage line, and a gate of the fourth transistor is coupled to an output terminal of the second inverter.

The present invention combines the N-type comparator with the input stage of the N-type transistor and the P-type comparator with the input stage of the P-type transistor. Accordingly, the rail-to-rail input/output feature can be achieved. In addition, both of the N-type and the P-type comparators co-drive the first and the second output stages so that fast charge/discharge can be performed while driving the next stage circuit. In addition, the charging rate is equal to the discharging rate.

The above and other features of the present invention will be better understood from the following detailed description of the preferred embodiments of the invention that is provided in communication with the accompanying drawings.

DESCRIPTION OF SOME EMBODIMENTS

Figure 1:
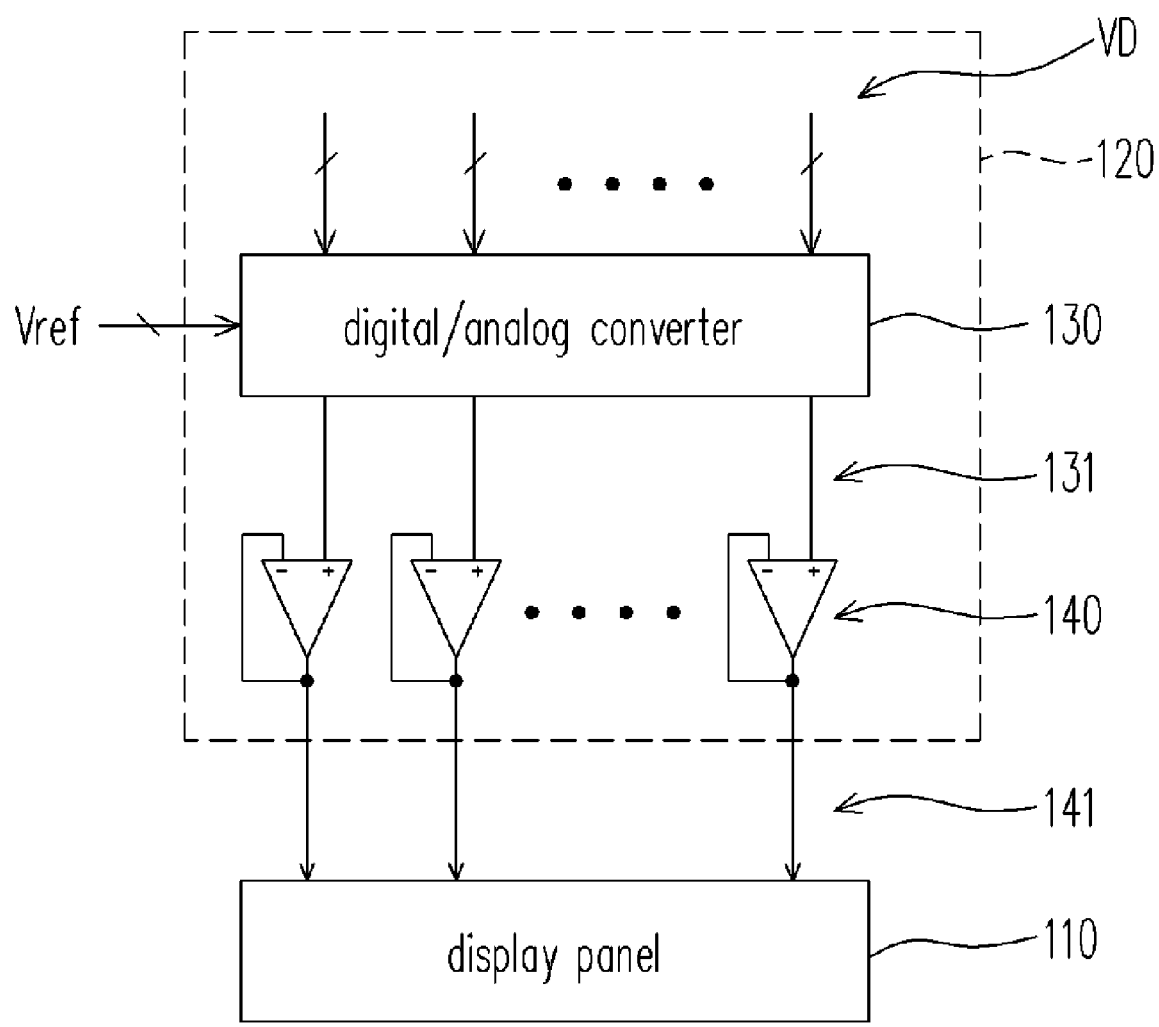
FIG. 1 is a block diagram showing a partial liquid crystal display according to an embodiment of the present invention.

In order to interpret the present invention, following are embodiments of a liquid crystal display, but the present invention is not limited thereto. FIG. 1 is a block diagram showing a partial liquid crystal display according to an embodiment of the present invention. Referring to FIG. 1, the liquid crystal display comprises a display panel 110 and a source driver 120. The source driver 120 comprises a digital/analog converter 130 and a push-pull buffer amplifier 140.

The digital/analog converter 130 receives a plurality of digital video signals VD. The digital video signals VD are converted into a plurality of analog input signals 131 by the digital/analog converter 130. The push-pull buffer amplifier 140 is coupled to the digital/analog converter 130 to transmit input signals 131, and to generate output signals 141 to drive the display panel 110. Wherein, the push-pull buffer amplifier 140 can be referred in FIG. 2.

Figure 2:
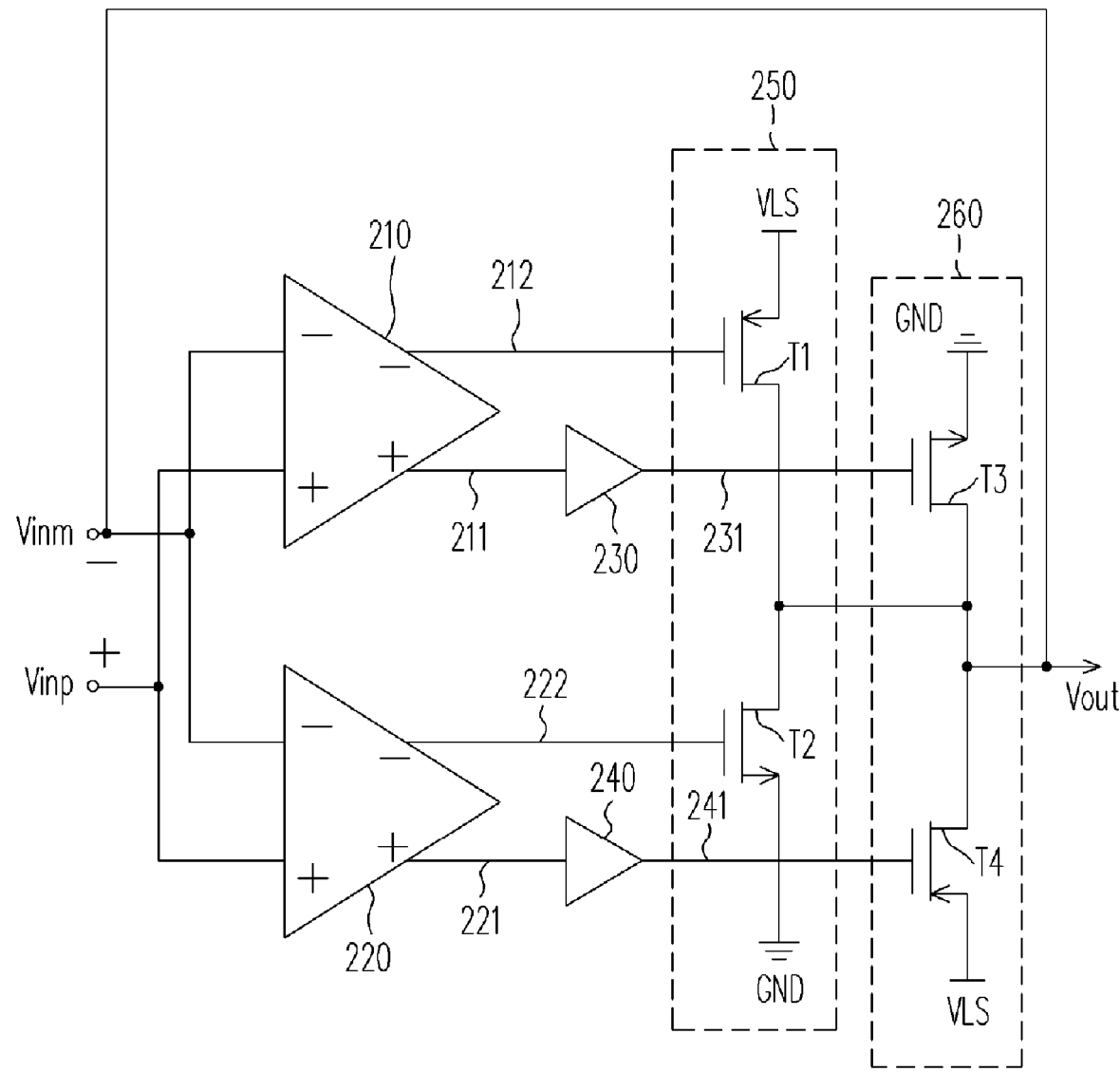
FIG. 2 is a block diagram showing a push-pull buffer amplifier according to an embodiment of the present invention.

FIG. 2 is a block diagram showing a push-pull buffer amplifier according to an embodiment of the present invention. Referring to FIG. 2, the push-pull buffer amplifier 200 is one of the push-pull buffer amplifiers 140 in FIG. 1. The push-pull buffer amplifier 200 comprises an N-type comparator 210, a P-type comparator 220, a first inverter 230, a second inverter 240, a first output stage 250, and a second output stage 260. Wherein, the first output stage 250 comprises a P-type transistor T1 and an N-type transistor T2; the second output stage 260 comprises an N-type transistor T3 and a P-type transistor T4.

In this embodiment, the N-type comparator comprises an N-type transistor serving as its input stage. Similarly, the P-type comparator comprises a P-type transistor serving as its input stage.

The push-pull buffer amplifier 200 comprises a positive input terminal "+", a negative input terminal "−", and an output terminal. The output signal Vout from the output terminal is fed back to the negative input terminal "−" so that the negative input terminal signal Vinm is equal to the output signal Vout. The N-type comparator 210 receives and compares the input signal Vinp and the output signal Vout through the positive input terminal and the negative input terminal, respectively. The first output terminal, i.e., the positive output terminal, and the second output terminal, i.e., the negative output terminal, which are reversed to each other output a comparison result. For example, if the input signal Vinp is larger than the output signal Vout, the first output terminal outputs a high-level signal, and the second output terminal reversed to the first output terminal outputs a low-level signal.

The P-type comparator 220 is similar to the N-type comparator 210, comprising a positive input terminal, a negative input terminal, a first output terminal, i.e., a positive output terminal, and a second output terminal, i.e., a negative output terminal. The P-type comparator 220 receives and compares the input signal Vinp and the output signal Vout through the positive input terminal and the negative input terminal, respectively. The first output terminal and the second output terminal, which are reversed to each other, output a comparison result. For example, if the input signal Vinp is smaller than the output signal Vout, the first output terminal outputs a low-level signal, and the second output terminal reversed to the first output terminal outputs a high-level signal.

The first inverter 230 inverts the output signal 211 from the first output terminal of the N-type comparator 210, and then generates a signal 231. Similarly, the second inverter 240 inverts the output signal 221 from the first output terminal of the P-type comparator 220, and then generates a signal 241.

In the fist output stage 250, the P-type transistor T1 and the N-type transistor T2 are controlled by the output signal 212 from the second output terminal of the N-type comparator 210 and the output signal 222 from the second output terminal of the P-type comparator 220, respectively. The source of the transistor T1 is coupled to the first voltage line (hereinafter "power voltage line VLS"), whose gate is coupled to the second output terminal of the comparator 210. The drain of the transistor T2 is coupled to the drain of the transistor T1. The source of the transistor T2 is coupled to the second voltage line (hereinafter "ground voltage line GND"). The gate of the transistor T2 is coupled to the second output terminal of the comparator 220.

In the second output stage 260, the N-type transistor T3 and the P-type transistor T4 are controlled by the output signal 231 from the output terminal of the first inverter 230 and the output signal 241 from the output terminal of the second inverter 240, respectively. The gate of the transistor T3 is coupled to the output terminal of the first inverter 230, whose source is coupled to the ground voltage line GND, and the drain is coupled to the drain of the first transistor T1. Wherein, the signal of the drain of the transistor T3 is the output signal Vout to be output from the push-pull buffer amplifier 200. The drain of the transistor T4 is coupled to the drain of the transistor T3. The source of the transistor T4 is coupled to the power voltage line VLS. The gate of the transistor T4 is coupled to the output terminal of the second inverter 240.

If the input signal Vinp is larger than VLS-Vthp (Vthp represents the threshold voltage of the P-type transistor), since the input signal Vinp is not sufficient to turn on the P-type transistor of the P-type comparator 220, the P-type comparator 220 cannot normally function. The output signals 221 and 222 are in a low level state, and the signal 241 is in a high state. Accordingly, the transistors T2 and T4 are turned off. Because the input signal Vinp is larger than the threshold voltage Vthn of the N-type transistor, the N-type comparator 210 still functions normally. If the input signal Vinp is larger than the output signal Vout, the output signals 211 and 212 are in a high level state and a low level state, respectively. The signal 231 is also in a low level state. The transistor T1 is turned on and the transistor T3 is turned off. The power voltage VLS charges the output load, such as the liquid crystal capacitor 110 of the display panel in FIG. 1, through the transistor T1. By contrast, if the input signal Vinp is smaller than the output signal Vout, the output signals 211 and 212 are in a low level state and a high level state, respectively. The signal 231 is in a high level state too. The transistor T1 is turned off, and the transistor T3 is turned on. The output load discharges to the ground voltage line GND through the transistor T3.

If the input signal Vinp is between the threshold voltage Vthn and VLS-Vthp, the input signal Vinp turns on the P-type transistor and the N-type transistor. Accordingly, both of the P-type comparator 220 and the N-type comparator 210 can function normally. If the input signal Vinp is larger than the output signal Vout, the output signals 211 and 221 are in a high level state, the signals 231 and 241 are in a low level state, and the output signals 212 and 222 are in a low level state. Accordingly, the transistor T1 and T4 are turned on, and the transistors T2 and T3 are turned off. The power voltage VLS thus charges the output load through the transistors T1 and T4. On the contrary, if the input signal Vinp is smaller than the output signal Vout, the output signals 211 and 221 are in a low level state and the signals 231 and 241 are in a high level state, and the output signals 212 and 222 are in a high level state. Accordingly, the transistors T1 and T4 are turned off, and the transistors T2 and T3 are turned on. The output load discharges to the ground voltage line GND through the transistors T2 and T3.

If the input signal Vinp is smaller than the threshold voltage Vthn, the input signal Vinp is not sufficient to turn on the N-type transistor of the N-type comparator 210. The N-type comparator 210 thus cannot function normally. The output signals 211 and 212 are in a high level state, and the signal 231 is in a low level state. The transistors T1 and T3 are thus turned off. Meanwhile, since the input signal Vinp is higher than the threshold voltage Vthp of the P-type transistor, the P-type comparator 220 still can function normally. If the input signal Vinp is larger than the output signal Vout, the output signals 221 and 222 are in a high level state and a low level state, respectively. The signal 241 is in a low level state. Accordingly, the transistor T4 is turned on and the transistor T2 is turned off. The power voltage VLS charges the output load, such as the liquid crystal capacitor of the display panel 110 in FIG. 1, through the transistor T4. However, if the input signal Vinp is smaller than the output signal Vout, the output signals 221 and 222 are in a low level state and a high level state, respectively. The signal 241 is also in a high level state. Accordingly, the transistor T4 is turned off, and the transistor T2 is turned on. The output load then discharges to the ground voltage line GND through the transistor T2.

Figure 3:
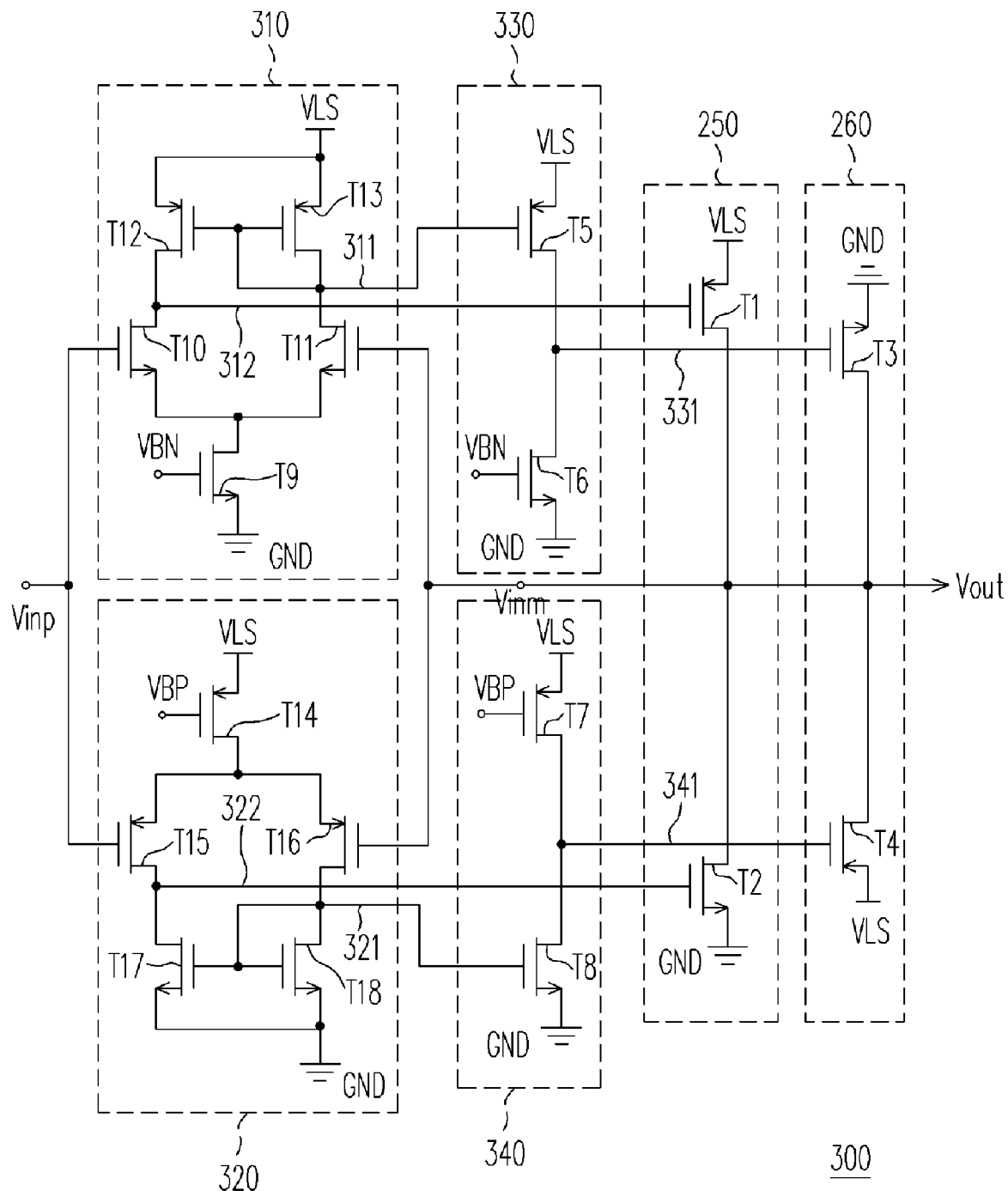
FIG. 3 is a schematic circuit diagram showing a push-pull buffer amplifier according to an embodiment of the present invention.

The described push-pull buffer amplifier 200 can be referred in FIG. 3. FIG. 3 is a schematic circuit diagram showing a push-pull buffer amplifier according to an embodiment of the present invention. The push-pull buffer amplifier 300 transmits the input signal Vinp to generate the output signal Vout. The push-pull buffer amplifier 300 comprises an N-type comparator 310, a P-type comparator 320, a first inverter 330, a second inverter 340, a first output stage 250, and a second output stage 260. The first output stage 250 and the second output stage 260 in FIG. 2 are similar to the first output stage 250 and the second output stage 260 in FIG. 1. Detailed descriptions are not repeated.

The N-type comparator 310 compares the input signal Vinp and the output signal Vout. The two output terminals which are reversed to each other output a comparison result, i.e., the signals 311 and 312 in FIG. 3. Meanwhile, the N-type comparator 310 comprises N-type transistors T9-T11 and P-type transistors T12 and T13. The source of the transistor T9 is coupled to the ground voltage line GND. The gate of the transistor T9 is coupled to the third voltage line, such as the bias voltage VBN of the N-type transistor with a pre-determined level. The source of the transistor T10 is coupled to the drain of the transistor T9. The drain of the transistor T10 is the second output terminal of the N-type comparator 310 for outputting the signal 312. The gate of the transistor T10 is the positive input terminal of the N-type comparator 310 to receive the input signal Vinp. The source of the transistor T11 is coupled to the drain of the transistor T9, and the drain of the transistor T11 is the first output terminal of the N-type comparator 310 for outputting the signal 311. The gate of the transistor T11 is the negative input terminal of the N-type comparator 310 to receive the input terminal signal Vinm. In this embodiment, the output signal Vout is fed back. The drain of the transistor T12 is coupled to the drain of the transistor T10. The source of the transistor T12 is coupled to the power voltage line VLS. The gate of the transistor T12 is coupled to the drain of the transistor T11. The drain of the transistor T13 is coupled to the drain of the transistor T11. The source of the transistor T13 is coupled to the power voltage line VLS. The gate of the transistor T13 is coupled to the gate of the transistor T12.

The P-type comparator 320 compares the input signal Vinp and the output signal Vout. Two output terminals which are reversed to each other output a comparison result, i.e., the signals 321 and 322 in FIG. 3. In this embodiment, the P-type comparator 320 comprises P-type transistors T14-T16 and N-type transistors T17 and T18. The source of the transistor T14 is coupled to the power voltage line VLS. The gate of the transistor T14 is coupled to the fourth voltage line, such as the bias voltage VBP of the P-type transistor with a pre-determined level. The source of the transistor T15 is coupled to the drain of the transistor T14. The drain of the transistor T15 is the second output terminal of the P-type comparator 320 for outputting the signal 322. The gate of the transistor T15 is the positive output terminal of the P-type comparator 320 to receive the input signal Vinp. The source of the transistor T16 is coupled to the drain of the transistor T14. The drain of the transistor T16 is the first output terminal of the P-type comparator 320 for outputting the signal 321. The gate of the transistor T16 is the negative input terminal of the P-type comparator 320 to receive the output signal Vout. The drain of the transistor T17 is coupled to the drain of the transistor T15. The source of the transistor T17 is coupled to the ground voltage line GND. The gate of the transistor T17 is coupled to the drain of the transistor T16. The drain of the transistor T18 is coupled to the drain of the transistor T16. The source of the transistor T18 is coupled to the ground voltage line GND. The gate of the transistor T18 is coupled to the gate of the transistor T17.

In the push-pull buffer amplifier 300, the first inverter 330 comprises a P-type transistor T5 and an N-type transistor T6. The gate of the transistor T5 is the input terminal of the first inverter 330 and coupled to the first output terminal of the N-type comparator 310. The source of the transistor T5 is coupled to the power voltage line VLS. The drain of the transistor T5 is the output terminal of the first inverter 330. The drain of the transistor T6 is coupled to the drain of the transistor T5. The source of the transistor T6 is coupled to the ground voltage line GND. The gate of the transistor T6 is coupled to the third voltage line, such as the bias voltage VBN of the N-type transistor with a pre-determined level.

In the push-pull buffer amplifier 300, the second inverter 340 comprises a P-type transistor T7 and an N-type transistor T8. The gate of the transistor T7 is coupled to the fourth voltage, such as the bias voltage VBP of the P-type transistor with a pre-determined level. The source of the transistor T7 is coupled to the power voltage line VLS. The drain of the transistor T7 is the output terminal of the second inverter 340. The drain of the transistor T8 is coupled to the drain of the transistor T7. The source of the transistor T8 is coupled to the ground voltage line GND. The gate of the transistor T8 is the output terminal of the second inverter 340 and coupled to the first output terminal of the P-type comparator 320.

During operation, either the P-type transistor or the N-type transistor is turned on in the first output stage 250. Similarly, either the N-type transistor or the P-type transistor is turned on in the second output stage 260. Thus, low-power consumption can be achieved. In addition, by integrating the N-type comparator and the P-type comparator, if the input signal Vinp is smaller than the threshold voltage Vthn and larger than VLS-Vthp, at least one of the N-type comparator and the P-type comparator can normally operate and drive the first and the second output stages. The rail-to-rail input/output feature is thus achieved. In addition, since the N-type and the P-type comparators co-drive the first and the second output stages, fast charging/discharging purpose can be achieved while the next stage circuit is driven. Moreover, the charging rate is equal to the discharging rate.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A push-pull buffer amplifier to transmit an input signal to generate an output signal, the push-pull buffer amplifier comprising:
    an N-type comparator comparing the input signal and the output signal, a first output terminal of the N-type comparator and a second output terminal of the N-type comparator inversed thereto outputting a comparison result, wherein N-type transistor in the N-type comparator serves as its input stage;
    a P-type comparator comparing the input signal and the output signal, a first output terminal of the P-type comparator and a second output terminal of the P-type comparator inversed thereto outputting another comparison result, wherein P-type transistor in the P-type comparator serves as its input stage;
    a first inverter;
    the first inverter comprising:
        a fifth transistor, a gate of the fifth transistor being coupled to the first output terminal of the N-type comparator, a first source/drain of the fifth transistor being coupled to a first voltage line, a second source/drain of the fifth transistor being the output terminal of the first inverter; and
        a sixth transistor, a first source/drain of the sixth transistor being coupled to the second source/drain of the fifth transistor, a second source/drain of the sixth transistor being coupled to a second voltage line, a gate of the sixth transistor being coupled to a third voltage line;
    a second inverter, an input terminal of the second inverter is coupled to the first output terminal of the P-type comparator;
    a first output stage comprising:
        a first transistor, a first source/drain of the first transistor being coupled to the first voltage line, a gate of the first transistor being coupled to the second output terminal of the N-type comparator; and
        a second transistor, a first source/drain of the second transistor being coupled to a second source/drain of the first transistor, a second source/drain of the second transistor being coupled to the second voltage line, a gate of the second transistor being coupled to the second output terminal of the P-type comparator; and
    a second output stage comprising:
        a third transistor, a gate of the third transistor being coupled to an output terminal of the first inverter, a first source/drain of the third transistor being coupled to the second voltage line, a second source/drain of the third transistor being coupled to the second source/drain of the first transistor, and outputting the output signal; and
        a fourth transistor, a first source/drain of the fourth transistor being coupled to the second source/drain of the third transistor, a second source/drain of the fourth transistor being coupled to the first voltage line, a gate of the fourth transistor being coupled to an output terminal of the second inverter.

2. The push-pull buffer amplifier of claim 1, wherein the first and the fourth transistors are P-type transistors and the second and the third transistors are N-type transistors.

3. The push-pull buffer amplifier of claim 1, wherein the first voltage line is a power voltage line and the second voltage line is a ground line.

4. The push-pull buffer amplifier of claim 1, wherein the fifth transistor is a P-type transistor and the sixth transistor is an N-type transistor.

5. The push-pull buffer amplifier of claim 1, wherein the second inverter comprises:
    a seventh transistor, a gate of the seventh transistor being coupled to a fourth voltage line, a first source/drain of the seventh transistor being coupled to the first voltage line, a second source/drain of the seventh transistor being the output terminal of the second inverter; and
    an eighth transistor, a first source/drain of the eighth transistor being coupled to the second source/drain of the seventh transistor, a second source/drain of the eighth transistor being coupled to the second voltage line, a gate of the eighth transistor being coupled to the first output terminal of the P-type comparator.

6. The push-pull buffer amplifier of claim 5, wherein the seventh transistor is a P-type transistor and the eighth transistor being an N-type transistor.

7. The push-pull buffer amplifier of claim 1, wherein the N-type comparator comprises:
    a ninth transistor, a first source/drain of the ninth transistor being coupled to the second voltage line, a gate of the ninth transistor being coupled to the third voltage line;
    a tenth transistor, a first source/drain of the tenth transistor being coupled to a second source/drain of the ninth transistor, a second source/drain of the tenth transistor being the second output terminal of the N-type comparator, a gate of the tenth transistor receiving the input signal;

an eleventh transistor, a first source/drain of the eleventh transistor being coupled to the second source/drain of the ninth transistor, a second source/drain of the eleventh transistor being the first output terminal of the N-type comparator, a gate of the eleventh transistor receiving the output signal;

a twelfth transistor, a first source/drain of the twelfth transistor being coupled to the second source/drain of the tenth transistor, a second source/drain of the twelfth transistor being coupled to the first voltage line, a gate of the twelfth transistor being coupled to the second source/drain of the eleventh transistor; and a thirteenth transistor, a first source/drain of the thirteenth transistor being coupled to the second source/drain of the eleventh transistor, a second source/drain of the thirteenth transistor being coupled to the first voltage line, a gate of the thirteenth transistor being coupled to the gate of the twelfth transistor.

8. The push-pull buffet amplifier of claim 7, wherein the ninth, the tenth, and the eleventh transistors are N-type transistors, and the twelfth and the thirteenth transistors are P-type transistors.

9. The push-pull buffer amplifier of claim 1, wherein the P-type comparator comprising:

a fourteenth transistor, a first source/drain of the fourteenth transistor being coupled to the first voltage line, a gate of the fourteenth transistor being coupled to a fourth voltage line;

a fifteenth transistor, a first source/drain of the fifteenth transistor being coupled to a second source/drain of the fourteenth transistor, a second source/drain of the fifteenth transistor being the second output terminal of the P-type comparator, a gate of the fifteenth transistor receiving the input signal;

a sixteenth transistor, a first source/drain of the sixteenth transistor being coupled to the second source/drain of the fourteenth transistor, a second source/drain of the sixteenth transistor being the first output terminal of the P-type comparator, a gate of the sixteenth transistor receiving the output signal;

a seventeenth transistor, a first source/drain of the seventeenth transistor being coupled to the second source/drain of the fifteenth transistor, a second source/drain of the seventeenth transistor being coupled to the second voltage line, a gate of the seventeenth transistor being coupled to the second source/drain of the sixteenth transistor; and an eighteenth transistor, a first source/drain of the eighteenth transistor being coupled to the second source/drain of the sixteenth transistor, a second source/drain of the eighteenth transistor being coupled to the second voltage line, a gate of the eighteen transistor being coupled to the gate of the seventeenth transistor.

10. The push-pull buffer amplifier of claim 9, wherein the fourteenth, the fifteenth, and the sixteenth transistors are P-type transistors, and the seventeenth and the eighteenth transistors are N-type transistors.

11. A source driver to drive a display panel, the source driver comprising:

a digital/analog converter converting a digital video signal to output an analog input signal; and a push-pull buffer amplifier being coupled to said digital/analog converter to transmit the input signal to generate an output signal, the push-pull buffer amplifier comprising:

an N-type comparator comparing the input signal and the output signal, a first output terminal of the N-type comparator and a second output terminal of the N-type comparator inversed thereto outputting a comparison result, wherein an N-type transistor in the N-type comparator serves as its input stage;

a P-type comparator comparing the input signal and the output signal, a first output terminal of the P-type comparator and a second output terminal of the P-type comparator inversed thereto outputting another comparison result, wherein a P-type transistor in the P-type comparator serves as its input stage;

a first inverter, the first inverter comprising:

a fifth transistor, a gate of the fifth transistor being coupled to the first output terminal of the N-type comparator, a first source/drain of the fifth transistor being coupled to a first voltage line, a second source/drain of the fifth transistor being the output terminal of the first inverter; and a sixth transistor, a first source/drain of the sixth transistor being coupled to the second source/drain of the fifth transistor, a second source/drain of the sixth transistor being coupled to a second voltage line, a gate of the sixth transistor being coupled to a third voltage line;

a second inverter, an input terminal of the second inverter is coupled to the first output terminal of the P-type comparator;

a first transistor, a first source/drain of the first transistor being coupled to the first voltage line, a gate of the first transistor being coupled to the second output terminal of the N-type comparator;

a second transistor, a first source/drain of the second transistor being coupled to the second source/drain of the first transistor, a second source/drain of the second transistor being coupled to a second voltage line, a gate of the second transistor being coupled to the second output terminal of the P-type comparator;

a third transistor, a gate of the third transistor being coupled to an output terminal of the first inverter, a first source/drain of the third transistor being coupled to the second voltage line, a second source/drain of the third transistor being coupled to the second source/drain of the first transistor, and outputting the output signal; and a fourth transistor, a first source/drain of the fourth transistor being coupled to the second source/drain of the third transistor, a second source/drain of the fourth transistor being coupled to the first voltage line, a gate of the fourth transistor being coupled to an output terminal of the second inverter.

12. The source driver of claim 11, wherein the first and the fourth transistors are P-type transistors and the second and the third transistors are N-type transistors.

13. The source driver of claim 11, wherein the first voltage line is a power voltage line, and the second voltage line is a ground line.

14. The source driver of claim 11, wherein the fifth transistor is a P-type transistor, and the sixth transistor is an N-type transistor.

15. The source driver of claim 11, wherein the second inverter comprises:

a seventh transistor, a gate of the seventh transistor being coupled to a fourth voltage line, a first source/drain of the seventh transistor being coupled to the first voltage line, a second source/drain of the seventh transistor being the output terminal of the second inverter; and an eighth transistor, a first source/drain of the eighth transistor being coupled to the second source/drain of the seventh transistor, a second source/drain of the eighth transistor being coupled to the second voltage line, a gate of the eighth transistor being coupled to the first output terminal of the P-type comparator.

16. The source driver of claim 15, wherein the seventh transistor is a P-type transistor and the eighth transistor being an N-type transistor.

17. The source driver of claim 11, wherein the N-type comparator comprises:
a ninth transistor, a first source/drain of the ninth transistor being coupled to the second voltage line, a gate of the ninth transistor being coupled to the third voltage line;
a tenth transistor, a first source/drain of the tenth transistor being coupled to a second source/drain of the ninth transistor, a second source/drain of the tenth transistor being the second output terminal of the N-type comparator, a gate of the tenth transistor receiving the input signal;
an eleventh transistor, a first source/drain of the eleventh transistor being coupled to the second source/drain of the ninth transistor, a second source/drain of the eleventh transistor being the first output terminal of the N-type comparator, a gate of the eleventh transistor receiving the output signal;
a twelfth transistor, a first source/drain of the twelfth transistor being coupled to the second source/drain of the tenth transistor, a second source/drain of the twelfth transistor being coupled to the first voltage line, a gate of the twelfth transistor being coupled to the second source/drain of the eleventh transistor; and
a thirteenth transistor, a first source/drain of the thirteenth transistor being coupled to the second source/drain of the eleventh transistor, a second source/drain of the thirteenth transistor being coupled to the first voltage line, a gate of the thirteenth transistor being coupled to the gate of the twelfth transistor.

18. The source driver of claim 17, wherein the ninth, tenth, and the eleventh transistors are N-type transistors, and the twelfth and the thirteenth transistors are P-type transistors.

19. The source driver of claim 11, wherein the P-type comparator comprising:
a fourteenth transistor, a first source/drain of the fourteenth transistor being coupled to the first voltage line, a gate of the fourteenth transistor being coupled to a fourth voltage line;
a fifteenth transistor, a first source/drain of the fifteenth transistor being coupled to a second source/drain of the fourteenth transistor, a second source/drain of the fifteenth transistor being the second output terminal of the P-type comparator, a gate of the fifteenth transistor receiving the input signal;
a sixteenth transistor, a first source/drain of the sixteenth transistor being coupled to the second source/drain of the fourteenth transistor, a second source/drain of the sixteenth transistor being the first output terminal of the P-type comparator, a gate of the sixteenth transistor receiving the output signal;
a seventeenth transistor, a first source/drain of the seventeenth transistor being coupled to the second source/drain of the fifteenth transistor, a second source/drain of the seventeenth transistor being coupled to the second voltage line, a gate of the seventeenth transistor being coupled to the second source/drain of the sixteenth transistor; and an eighteenth transistor, a first source/drain of the eighteenth transistor being coupled to the second source/drain of the sixteenth transistor, a second source/drain of the eighteenth transistor being coupled to the second voltage line, a gate of the eighteen transistor being coupled to the gate of the seventeenth transistor.

20. The source driver of claim 19, wherein the fourteenth, the fifteenth, and the sixteenth transistors are P-type transistors, and the seventeenth and the eighteenth transistors are N-type transistors.

21. The source driver of claim 11, wherein the display panel is a liquid crystal display panel.

22. A push-pull buffer amplifier to transmit an input signal to generate an output signal, the push-pull buffer amplifier comprising:
an N-type comparator comparing the input signal and the output signal, a first output terminal of the N-type comparator and a second output terminal of the N-type comparator inversed thereto outputting a comparison result, wherein N-type transistor in the N-type comparator serves as its input stage;
a P-type comparator comparing the input signal and the output signal, a first output terminal of the P-type comparator and a second output terminal of the P-type comparator inversed thereto outputting another comparison result, wherein P-type transistor in the P-type comparator serves as its input stage;
a first inverter, an input terminal of the first inverter is coupled to the first output terminal of the N-type comparator;
a second inverter, the second inverter comprising:
a seventh transistor, a gate of the seventh transistor being coupled to a fourth voltage line, a first source/drain of the seventh transistor being coupled to a first voltage line, a second source/drain of the seventh transistor being the output terminal of the second inverter; and
an eight transistor, a first source/drain of the eighth transistor being coupled to the second source/drain of the seventh transistor, a second source/drain of the eighth transistor being coupled to a second voltage line, a gate of the eighth transistor being coupled to the first output terminal of the P-type comparator;
a first output stage comprising:
a first transistor, a first source/drain of the first transistor being coupled to the first voltage line, a gate of the first transistor being coupled to the second output terminal of the N-type comparator; and
a second transistor, a first source/drain of the second transistor being coupled to a second source/drain of the first transistor, a second source/drain of the second transistor being coupled to the second voltage line, a gate of the second transistor being coupled to the second output terminal of the P-type comparator; and
a second output stage comprising:
a third transistor, a gate of the third transistor being coupled to an output terminal of the first inverter, a first source/drain of the third transistor being coupled to the second voltage line, a second source/drain of the third transistor being coupled to the second source/drain of the first transistor, and outputting the output signal; and
a fourth transistor, a first source/drain of the fourth transistor being coupled to the second source/drain of the third transistor, a second source/drain of the fourth transistor being coupled to the first voltage line, a gate of the fourth transistor being coupled to an output terminal of the second inverter.

23. The push-pull buffer amplifier of claim 22, wherein the first and the fourth transistors are P-type transistors and the second and the third transistors are N-type transistors.

24. The push-pull buffer amplifier of claim 22, wherein the first voltage line is a power voltage line and the second voltage line is a ground line.

25. The push-pull buffer amplifier of claim 22, wherein the seventh transistor is a P-type transistor and the eighth transistor being an N-type transistor.

26. The push-pull buffer amplifier of claim 22, wherein the N-type comparator comprises:
   a ninth transistor, a first source/drain of the ninth transistor being coupled to the second voltage line, a gate of the ninth transistor being coupled to a third voltage line;
   a tenth transistor, a first source/drain of the tenth transistor being coupled to a second source/drain of the ninth transistor, a second source/drain of the tenth transistor being the second output terminal of the N-type comparator, a gate of the tenth transistor receiving the input signal;
   an eleventh transistor, a first source/drain of the eleventh transistor being coupled to the second source/drain of the ninth transistor, a second source/drain of the eleventh transistor being the first output terminal of the N-type comparator, a gate of the eleventh transistor receiving the output signal;
   a twelfth transistor, a first source/drain of the twelfth transistor being coupled to the second source/drain of the tenth transistor, a second source/drain of the twelfth transistor being coupled to the first voltage line, a gate at the twelfth transistor being coupled to the second source/drain of the eleventh transistor; and
   a thirteenth transistor, a first source/drain of the thirteenth transistor being coupled to the second source/drain of the eleventh transistor, a second source/drain of the thirteenth transistor being coupled to the first voltage line, a gate of the thirteenth transistor being coupled to the gate of the twelfth transistor.

27. The push-pull buffer amplifier of claim 26, wherein the ninth, the tenth, and the eleventh transistors are N-type transistors, and the twelfth and the thirteenth transistors are P-type transistors.

28. The push-pull buffer amplifier of claim 22, wherein the P-type comparator comprising:
   a fourteenth transistor, a first source/drain of the fourteenth transistor being coupled to the first voltage line, a gate of the fourteenth transistor being coupled to the fourth voltage line;
   a fifteenth transistor, a first source/drain of the fifteenth transistor being coupled to a second source/drain of the fourteenth transistor, a second source/drain of the fifteenth transistor being the second output terminal of the P-type comparator, a gate of the fifteenth transistor receiving the input signal;
   a sixteenth transistor, a first source/drain of the sixteenth transistor being coupled to the second source/drain of the fourteenth transistor, a second source/drain of the sixteenth transistor being the first output terminal of the P-type comparator, a gate of the sixteenth transistor receiving the output signal;
   a seventeenth transistor, a first source/drain of the seventeenth transistor being coupled to the second source/drain of the fifteenth transistor, a second source/drain of the seventeenth transistor being coupled to the second voltage line, a gate of the seventeenth transistor being coupled to the second source/drain of the sixteenth transistor; and
   an eighteenth transistor, a first source/drain of the eighteenth transistor being coupled to the second source/drain of the sixteenth transistor, a second source/drain of the eighteenth transistor being coupled to the second voltage line, a gate of the eighteen transistor being coupled to the gate of the seventeenth transistor.

29. The push-pull buffer amplifier of claim 28, wherein the fourteenth, the fifteenth, and the sixteenth transistors are P-type transistors, and the seventeenth and the eighteenth transistors are N-type transistors.

30. A source driver to drive a display panel, the source driver comprising:
   a digital/analog converter converting a digital video signal to output an analog input signal; and
   a push-pull buffer amplifier being coupled to said digital/analog converter to transmit the input signal to generate an output signal, the push-pull buffer amplifier comprising:
      an N-type comparator comparing the input signal and the output signal, a first output terminal of the N-type comparator and a second output terminal of the N-type comparator inversed thereto outputting a comparison result, wherein an N-type transistor in the N-type comparator serves as its input stage;
      a P-type comparator comparing the input signal and the output signal, a first output terminal of the P-type comparator and a second output terminal of the P-type comparator inversed thereto outputting another comparison result, wherein a P-type transistor in the P-type comparator serves as its input stage;
      a first inverter, an input terminal of the first inverter is coupled to the first output terminal of the N-type comparator;
      a second inverter, the second inverter comprises:
         a seventh transistor, a gate of the seventh transistor being coupled to a fourth voltage line, a first source/drain of the seventh transistor being coupled to a first voltage line, a second source/drain of the seventh transistor being the output terminal of the second inverter; and
         an eighth transistor, a first source/drain of the eighth transistor being coupled to the second source/drain of the seventh transistor, a second source/drain of the eighth transistor being coupled to a second voltage line, a gate of the eighth transistor being coupled to the first output terminal of the P-type comparator;
      a first transistor, a first source/drain of the first transistor being coupled to the first voltage line, a gate of the first transistor being coupled to the second output terminal of the N-type comparator;
      a second transistor, a first source/drain of the second transistor being coupled to a second source/drain of the first transistor, a second source/drain of the second transistor being coupled to the second voltage line, a gate of the second transistor being coupled to the second output terminal of the P-type comparator;
      a third transistor, a gate of the third transistor being coupled to an output terminal of the first inverter, a first source/drain of the third transistor being coupled to the second voltage line, a second source/drain of the third transistor being coupled to the second source/drain of the first transistor, and outputting the output signal; and a fourth transistor, a first source/drain of the fourth transistor being coupled to the second source/drain of the third transistor, a second source/drain of the fourth transistor being coupled to the first voltage line, a gate of the fourth transistor being coupled to an output terminal of the second inverter.

31. The source driver of claim 30, wherein the first and the fourth transistors are P-type transistors and the second and the third transistors are N-type transistors.

32. The source driver of claim 30, wherein the first voltage line is a power voltage line, and the second voltage line is a ground line.

33. The source driver of claim 30, wherein the seventh transistor is a P-type transistor and the eighth transistor being an N-type transistor.

34. The source driver of claim 30, wherein the N-type comparator comprises:
- a ninth transistor, a first source/drain of the ninth transistor being coupled to the second voltage line, a gate of the ninth transistor being coupled to a third voltage line;
- a tenth transistor, a first source/drain of the tenth transistor being coupled to a second source/drain of the ninth transistor, a second source/drain of the tenth transistor being the second output terminal of the N-type comparator, a gate of the tenth transistor receiving the input signal;
- an eleventh transistor, a first source/drain of the eleventh transistor being coupled to the second source/drain of the ninth transistor, a second source/drain of the eleventh transistor being the first output terminal of the N-type comparator, a gate of the eleventh transistor receiving the output signal;
- a twelfth transistor, a first source/drain of the twelfth transistor being coupled to the second source/drain of the tenth transistor, a second source/drain of the twelfth transistor being coupled to the first voltage line, a gate of the twelfth transistor being coupled to the second source/drain of the eleventh transistor; and
- a thirteenth transistor, a first source/drain of the thirteenth transistor being coupled to the second source/drain of the eleventh transistor, a second source/drain of the thirteenth transistor being coupled to the first voltage line, a gate of the thirteenth transistor being coupled to the gate of the twelfth transistor.

35. The source driver of claim 34, wherein the ninth, the tenth, and the eleventh transistors are N-type transistors, and the twelfth and the thirteenth transistors are P-type transistors.

36. The source driver of claim 30, wherein the P-type comparator comprising:
- a fourteenth transistor, a first source/drain of the fourteenth transistor being coupled to the first voltage line, a gate of the fourteenth transistor being coupled to the fourth voltage line;
- a fifteenth transistor, a first source/drain of the fifteenth transistor being coupled to a second source/drain of the fourteenth transistor, a second source/drain of the fifteenth transistor being the second output terminal of the P-type comparator, a gate of the fifteenth transistor receiving the input signal;
- a sixteenth transistor, a first source/drain of the sixteenth transistor being coupled to the second source/drain of the fourteenth transistor, a second source/drain of the sixteenth transistor being the first output terminal of the P-type comparator, a gate of the sixteenth transistor receiving the output signal;
- a seventeenth transistor, a first source/drain of the seventeenth transistor being coupled to the second source/drain of the fifteenth transistor, a second source/drain of the seventeenth transistor being coupled to the second voltage line, a gate of the seventeenth transistor being coupled to the second source/drain of the sixteenth transistor; and
- an eighteenth transistor, a first source/drain of the eighteenth transistor being coupled to the second source/drain of the sixteenth transistor, a second source/drain of the eighteenth transistor being coupled to the second voltage line, a gate of the eighteen transistor being coupled to the gate of the seventeenth transistor.

37. The source driver of claim 36, wherein the fourteenth, the fifteenth, and the sixteenth transistors are P-type transistors, and the seventeenth and the eighteenth transistors are N-type transistors.

38. The source driver of claim 30, wherein the display panel is a liquid crystal display panel.

* * * * *